United States Patent [19]

Larson

[11] 4,380,055

[45] Apr. 12, 1983

[54] STATIC RAM MEMORY CELL

[75] Inventor: David N. Larson, Carrollton, Tex.

[73] Assignee: Mostek Corporation, Carrollton, Tex.

[21] Appl. No.: 278,907

[22] PCT Filed: Dec. 24, 1980

[86] PCT No.: PCT/US80/01725
§ 371 Date: Dec. 24, 1980
§ 102(e) Date: Dec. 24, 1980

[87] PCT Pub. No.: WO82/02277
PCT Pub. Date: Jul. 8, 1982

[51] Int. Cl.³ .............................................. G11C 7/06
[52] U.S. Cl. ..................................... 365/154; 365/203
[58] Field of Search ............... 365/174, 182, 203, 230, 365/189, 154

[56] References Cited
U.S. PATENT DOCUMENTS

| | | | |
|---|---|---|---|
| 3,967,252 | 6/1976 | Donnelly | 365/154 |
| 4,193,127 | 3/1980 | Gersbach | 365/174 |
| 4,272,811 | 6/1981 | Wong | 365/174 |

Primary Examiner—Terrell W. Fears

[57] ABSTRACT

A memory cell (10) for storing data having a data line (12) and a bit enable line (16) for receiving control signals is provided. First and second signal lines (24, 26) receive control signals. A first transistor (14) is interconnected to the data line (12) and to the bit enable line (16). A second transistor (20) is connected to the first transistor (14) and to the first control line (24). A third transistor (22) is connected to the first transistor (14) and to the second control line (26). A first inverter (30) is interconnected to the second transistor (20) to form a first node (34) and to the third transistor (22) to form a second node (36). A second inverter (32) is interconnected between the first node (34) and the second node (36).

9 Claims, 2 Drawing Figures

STATIC RAM MEMORY CELL

TECHNICAL FIELD

This invention relates to random access memories, and more particularly to a static MOS random access memory cell utilizing no sense amplifiers.

BACKGROUND ART

Large scale integration techniques have brought about the construction of large arrays of binary storage elements on a single chip of silicon. The storage cells, typically using MOS technology, consist of multicomponent circuits in a conventional bistable configuration. There are numerous advantages of such semiconductor storage devices including high packing density and low power requirements of such memory cells.

Numerous prior art static memory cells of an integrated circuit memory have been developed. A well known static memory cell circuit arrangement which utilizes six insulated gate MOS field-effect transistors is a cross-coupled inverter stage shown in U.S. Pat. No. 3,967,252 issued to Donnelly on June 29, 1976 and entitled "Sense Amp for Random Access Memory". Because of the relatively small capacitance of the cells compared to the capacitance of the column line, the voltage swing is usually small requiring the use of sense amplifier circuits to detect this small voltage swing on a column line. Such a sense amplifier is disclosed in the above referred to Donnelly patent. The use of sense amplifiers substantially complicates the fabrication and operation of a static memory cell.

A need has thus arisen for a static RAM cell in which data stored therein can be read by reading the logic levels stored therein without the use of sense amplifers. A need has further arisen for a low voltage operating static RAM cell operating with minimal quiescent current and which utilizes an X-Y addressing technique.

DISCLOSURE OF THE INVENTION

In accordance with the present invention, a static random access memory cell is provided having improved read out capabilities, operating at low voltage with low quiescent current.

In accordance with the present invention, a memory cell for storing data having a data signal line and a bit signal line for receiving control signals, first and second control lines for receiving control signals and a cell voltage supply source is provided. A first transistor is interconnected to the data signal line and to the bit signal line and is activated by a control signal. A second transistor is provided and is connected to the first transistor and to the first control line for being activated by a control signal. A third transistor is provided and is connected to the first transistor and to the second control line for being activated by a control signal. A first inverter is coupled to the cell voltage supply and to the second and third transistors. A second inverter is coupled to the cell voltage supply and to the second and third transistors. The first and second inverters are cross-coupled to the second and third transistors for storing date within the memory cell.

BRIEF DESCRIPTION OF DRAWINGS

For a more complete understanding of the present invention and for further advantages thereof, reference will now be made to the following Detailed Description taken in conjunction with the accompanying Drawings in which.

DETAILED DESCRIPTION

Figure 1:
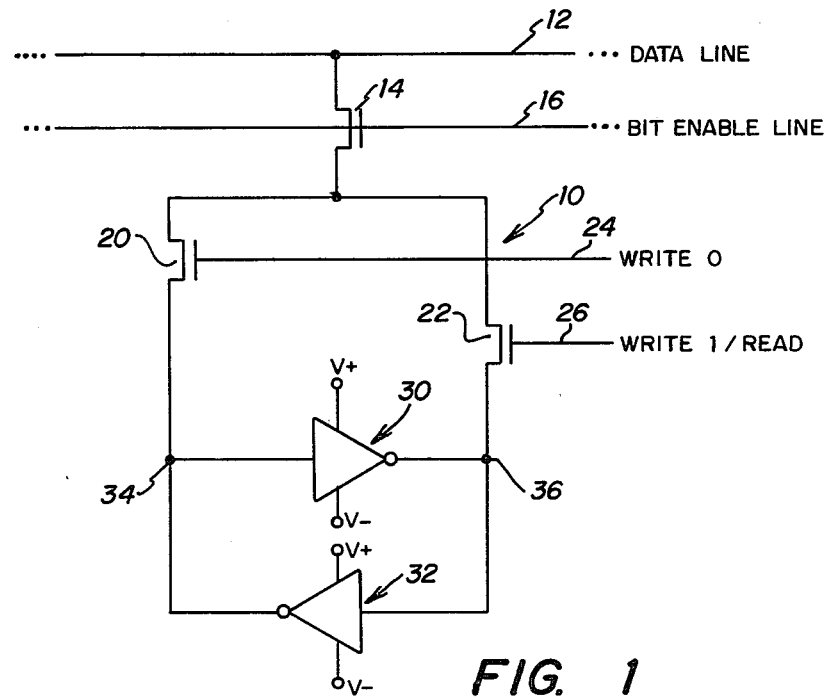
FIG. 1 is a schematic circuit diagram of the memory cell of the present invention.

Referring to FIG. 1, the memory cell of the present invention is illustrated and is generally identified by the numeral 10. Memory cell 10 is utilized as part of an array of numerous such cells arranged in rows and columns in a conventional manner to form a random access memory. The random access memory thereby formed using memory cell 10 may be fabricated on a single semiconductor chip and is primarily intended for such fabrication utilizing metal-oxide-semiconductor technology.

When arranged in an array of memory cells, memory cells 10 are interconnected to a common data line 12. Data stored within a memory cell 10 is read from memory cell 10 via data line 12 which is initially precharged using a data line input circuit (not shown). Access from a memory cell 10 to data line 12 is provided by an access transistor 14. The gate of access transistor 14 receives the bit enable control signal via bit enable line 16. The bit enable control signal selects a particular memory cell 10 along data line 12 which is to be read from or written into. The drain terminal of access transistor 14 is interconnected to date line 12. The source terminal of access transistor 14 is interconnected to the drain terminals of transistors 20 and 22. Transistors 20 and 22 are address transistors for memory cell 10. The gate terminal of address transistor 20 receives a control signal WRITE 0 via signal line 24. The gate terminal of address transistor 22 receives a control signal WRITE 1/READ via signal line 26.

Interconnected across the source terminals of address transistors 20 and 22 are cross-coupled inverters generally identified by the numerals 30 and 32. The source terminal of transistor 20 is interconnected to the input of inverter 30 to form a node 34. The output terminal of inverter 30 is interconnected to the source terminal of transistor 22 to form a node 36. The input terminal of inverter 32 is interconnected to node 36. The output terminal of inverter 32 is interconnected to node 34.

In operation of the present memory cell 10, in order to write data into a memory cell 10, the voltage level on data line 12 is pulled to a logic low by the data line input circuit. The bit enable control signal for the particular memory cell 10 being accessed will be pulled to a logic high, such that access transistor 14 will be activated. Assume initially that a logic high was previously stored within memory cell 10 at node 34 and it is desired to write a logic 0 into the memory cell 10. The WRITE 0 control signal is pulled high to activate transistor 20. The WRITE 1/READ control signal is low at this time, such that transistor 22 is inactive. Since access transistor 14 has been activated in addition to transistor 20, node 34 is pulled low to the value on data line 12, thereby storing a logic low value at node 34 within memory cell 10.

In order to store a logic one in a memory cell 10, the WRITE 0 control signal is pulled low and the WRITE 1/READ control signal pulls signal line 26 high, to thereby activate transistor 22. With transistor 22 activated, in addition to transistor 14, node 36 is pulled low to the value of data line 12. The value on node 36 is then inverted by inverter 32 to store a logic high at node 34, thereby storing a logic high within memory cell 10.

In order to read data from memory cell 10, data line 12 is initially precharged to a logic high. The bit enable control signal for the particular memory cell 10 being accessed is pulled high such that access transistor 14 is activated. The control signal WRITE 1/READ pulls signal line 26 high, such that transistor 22 is activated. The voltage level stored at node 36 will then control the voltage level on data line 12. If a logic high was stored in node 36, since transistors 14 and 22 are activated, the initialized precharged value on data line 12 will remain high to thereby read a logic 1. If a logic 0 were stored in node 36, the voltage on data line 12 will be pulled low through transistors 14 and 22 to thereby indicate that a logic 0 was stored in node 36.

It therefore can be seen that the memory cell 10 can be read without the use of sense amplifiers utilized in previously developed memory cells. The full logic levels are read, such that small voltage swings on the data line need not be sensed, since the complete swing from a logic high to a logic low is utilized to determine the value of the data stored within memory cell 10. Additionally, the present memory cell 10 utilizes a single signal line, signal line 26 for a WRITE 1 operation as well as a READ operation. Further, the present memory cell 10 can be utilized in an X-Y addressing technique.

Figure 2:
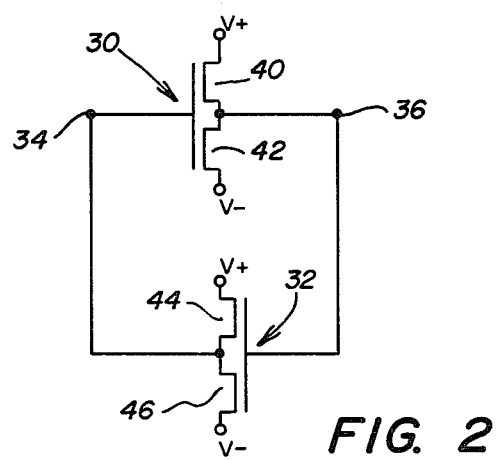
FIG. 2 is a schematic diagram of the cross-coupled inverters illustrated in FIG. 1.

FIG. 2 illustrates circuitry comprising inverters 30 and 32 which may comprise, for example, CMOS inverters. Inverter 30 includes transistors 40 and 42. The gate terminals of transistors 40 and 42 are interconnected to node 34. The drain terminals of transistors 40 and 42 are interconnected to node 36. Inverter 32 includes transistors 44 and 46. The gate terminals of transistors 44 and 46 are interconnected to node 36. The drain terminals of transistors 44 and 46 are interconnected to node 34. Transistors 40 and 44 may comprise, for example, P-channel MOS transistors. Transistors 42 and 46 may comprise, for example, N-channel MOS transistors.

The use of the present memory cell 10, having no sense amplifiers, operates with low quiescent current. Additionally, the present memory cell 10 operates at low voltages.

Whereas the present invention has been described with respect to specific embodiments thereof, it will be understood that various changes and modifications will be suggested to one skilled in the art and it is intended to encompass such changes and modifications as fall within the scope of the appended claims.

I claim:

1. A memory cell for storing data comprising:
a cell voltage supply source;
a data signal line for receiving control signals;
a bit signal line for receiving control signals;
first and second control lines for receiving control signals;
first transistor means connected to said data signal line and to said bit signal line;
second transistor means connected to said first transistor means and to said first control line;
third transistor means connected to said first transistor means and to said second control line;
first inverter means connected to said cell voltage supply source and having an input and output terminal, said input terminal being connected to said second transistor means to form a first node for storing data, said output terminal being connected to said third transistor means thereby forming a second node for storing data; and
second inverter means connected to said cell voltage supply source and having an input and output terminal, said input terminal being connected to said first node and said output terminal being connected to said second node.

2. The memory cell of claim 1 wherein said second transistor means is activated by a control signal received by said first control line for causing storage of a logic low in said first node.

3. The memory cell of claim 1 wherein said third transistor means is activated by a control signal received by said second control line for causing storing a logic high in said first node.

4. The memory cell of claim 1 wherein said third transistor means is activated by a control signal received by said second control line for causing data to be read from said second node.

5. A memory cell for storing data comprising:
a cell voltage supply source;
a data signal line for receiving control signals;
a bit signal line for receiving control signals;
first and second control lines for receiving control signals;
first transistor means having first and second terminals and a control terminal, said first terminal connected to said data signal line and said control terminal connected to said bit signal line, such that said first transistor means is activated by a first control signal received by said bit signal line;
second transistor means having first and second terminals and a control terminal, said first terminal being connected to said second terminal of said first transistor means and said control terminal being connected to said first control line, such that said second transistor means is activated by a second control signal received by said first control line;
third transistor means having first and second terminals and a control terminal, said first terminal being connected to said second terminal of said first transistor means and said control terminal being connected to said second control line, such that said third transistor means is activated by a third control signal received by said second control line;
first inverter means connected to said cell voltage supply source and having input and output terminals, said input terminal being connected to said second terminal of said second transistor means to form a first node and said output terminal being connected to said second terminal of said third transistor means to form a second node;
second inverter means connected to said cell voltage supply source and having input and output terminals, said input terminal being connected to said second node and said output terminal being connected to said first node; and
said first, second and third transistor means being operable, such that data is stored in the memory cell by activation of said first transistor means and one of said second or third transistor means, and data is read from the memory cell by activation of said first transistor means and said third transistor means.

6. The memory cell of claim 5 wherein said first inverter means includes fourth and fifth transistor means each having first and second terminals and a control terminal, said control terminals thereof being connected to said first node, said first terminal of said fourth transistor means and said second terminal of said fifth transistor means being connected to said cell voltage supply source, said second terminal of said fourth transistor means and said first terminal of said fifth transistor means being connected to said second node; and said second inverter means including sixth and seventh transistor means each having first and second terminals and a control terminal, said control terminals thereof being connected to said second node, said first terminal of said sixth transistor means and said second terminal of said seventh transistor means being connected to said cell voltage supply source, said second terminal of said sixth transistor means and said first terminal of said seventh transistor means being connected to said first node.

7. The memory cell of claim 6 wherein said first, second, third, fifth and seventh transistor means comprise N-channel MOS devices and said fourth and sixth transistor means comprise P-channel MOS devices.

8. The memory cell of claim 5 wherein said first control line receives said second control signal for activating said second transistor means for writing a logic low into the memory cell.

9. The memory cell of claim 5 wherein said second control line receives said third control signal for activating said third transistor means for writing a logic high into the memory cell and for reading data stored within the memory cell on the data signal line.

* * * * *